United States Patent
Lauxtermann et al.

(10) Patent No.: US 6,452,153 B1
(45) Date of Patent: Sep. 17, 2002

(54) OPTOELECTRONIC SENSOR

(75) Inventors: Stefan Lauxtermann, Berikon; Martin Waeny, Interlaken, both of (CH)

(73) Assignee: CSEM Centre Suisse d'Electronique et de Microtechnique SA, Neuchatel (CH)

( * ) Notice: Subject to any disclaimer, the term of this patent is extended or adjusted under 35 U.S.C. 154(b) by 0 days.

(21) Appl. No.: 09/716,168

(22) Filed: Nov. 17, 2000

(30) Foreign Application Priority Data

Nov. 19, 1999 (EP) .............................. 99811074

(51) Int. Cl.$^7$ .................. H01L 27/00; H04N 3/14; H04N 5/335
(52) U.S. Cl. ............... 250/208.1; 348/302; 348/317
(58) Field of Search ................... 250/208.1, 208.2; 348/294, 302, 303, 300, 301, 308, 317

(56) References Cited

U.S. PATENT DOCUMENTS 5,909,026 A * 6/1999 Zhou et al. ............. 250/208.1
6,104,844 A * 8/2000 Alger-Meunier ............ 382/312

FOREIGN PATENT DOCUMENTS

| EP | 0 898 312 A2 | 2/1999 |
| EP | 0 913 869 A2 | 5/1999 |
| EP | 0 954 032 A2 | 11/1999 |
| EP | 0 989 741 A2 | 3/2000 |

OTHER PUBLICATIONS

Seitz, P. et al.: "Smart optical and image sensors fabricated with industrial CMOS/CCD semiconductor processes", Proceedings of the SPIE—Charge Coupled Devices and Solid State Optical Sensors III, vol. 1900, Feb. 2–3, 1993, pp. 21–30, XP000904996, S. Jose, CA.

* cited by examiner

Primary Examiner—Stephone Allen
(74) Attorney, Agent, or Firm—Rankin, Hill, Porter & Clark LLP

(57) ABSTRACT

The optoelectronic sensor comprises at least two pixels (1.11, 1.12, 1.21, 1.22), each pixel (1.11, 1.12, 1.21, 1.22) comprising a photodiode (2), and means for electrically connecting at least two pixels, the connecting means comprising FETs (6) for switching the connection on or off. The pixels (1.11, 1.12, 1.21, 1.22) are designed in such a way that if, e.g., four pixels (1.11, 1.12, 1.21, 1.22) are connected the photocharges generated in the connected pixels (1.11, 1.12, 1.21, 1.22) are combined in one of the connected pixels (1.22), whereby the spatial resolution of the sensor is reduced. A skimming FET (3) arranged between the photodiode (2) and a charge detection circuit (4) offers a floating source and floating drain in each pixel (1.11, 1.12, 1.21, 1.22). Thus the sensor can be manufactured in CMOS technology and is suited for photocharge binning. The invention makes it possible to vary the spatial resolution, the light sensitivity and/or the readout velocity by purely electronic means. This has the advantage of an increased light sensitivity, and, moreover, of being offset free. The power consumption of the sensor is reduced at a constant frame frequency if the spatial resolution is reduced.

14 Claims, 8 Drawing Sheets

Fig. 6

OPTOELECTRONIC SENSOR

BACKGROUND OF THE INVENTION

The invention relates to an optoelectronic sensor having at least two pixels wherein each pixel has a diode-based photodetector for generating an electric photocharge as a function of incident electromagnetic radiation, and means for electrically connecting at least two pixels, wherein the connecting means includes means (6) for switching the connection on or off. The invention further relates to a method for detecting electromagnetic radiation using such an optoelectronic sensor, including the steps of generating an electric photocharge as a function of incoming electromagnetic radiation, and electrically connecting at least two pixels.

To date, two principles for solid-state image sensors prevail: charge-coupled-device (CCD) sensors and active-pixel sensors (APS). CCD sensors need a special manufacturing technology and have a relatively high power consumption. On the other hand, with CCD image sensors it is possible to increase the light sensitivity by concentrating in one single pixel the electric charge generated in several pixels. By doing this, the spatial resolution is reduced, but also the readout time and the power consumption are reduced. Thus CCD sensors can exploit the photocharge detection sensitivity of one pixel and the photocharge collection capability of many adjacent pixels. This operation mode, which is called "charge binning", is described, e.g., in P. Seitz et al., "Smart optical and image sensors fabricated with industrial CMOS/CCD semiconductor processes", SPIE Vol. 1900, pp. 21–30, 2–3 February 1993. However, the readout time, or the power consumption (for a constant frame frequency), cannot be reduced by the same factor as the spatial resolution, because for a readout it is necessary to drive the whole sensor.

APS sensors have the advantage of being realizable with standard complementary metal oxide semiconductor (CMOS) processes and of showing a relatively low power consumption. In an APS sensor, in each pixel the charge or current generated by the photodetector is actively converted into a voltage or current signal. Each pixel can be addressed and read out individually. It is possible with APS sensors to increase the readout velocity and/or the power consumption by reducing the spatial resolution. To date, it was however not possible to increase the light sensitivity of a pixel by interconnecting several pixels of an APS sensor. Of course, it is possible to connect CMOS pixels with suitably placed MOS-FET switches to form one big "super-pixer". Although the effective photocharge collection area is enlarged in this way, the CMOS pixels find themselves all connected in parallel, enlarging the total capacitance of the "super-pixel". No mechanism has been known to force the distributed photocharge from the "super-pixel" into one CMOS pixel for sensitive charge detection in this pixel.

SUMMARY OF THE INVENTION

It is therefore an aim of the present invention to provide an optoelectronic sensor that comprises diode-based photodetectors and is suited for photocharge binning. It is a further aim of the invention to provide a method for detecting light with diode-based photodetectors that make photocharge binning possible.

The invention encompasses:
- a suitable topology of, preferably, CMOS pixels (with photodiode, reset gate and charge detector circuit) which are interconnected with MOS-FET switches controlled from the outside;
- special charge detection circuits which have an additional MOS-FET ("skimmer") at their inputs, offering a floating source and floating drain; and
- an operation mode in which the MOS-FET switches can be controlled to interconnect the pixels, and the skimming MOS-FET's gate is set to a DC potential which lies below the charge detection circuit's reset voltage.

The optoelectronic sensor according to the invention comprises at least two pixels, each pixel having a diode-based photodetector for generating an electric photocharge as a function of incident electromagnetic radiation, and means for electrically connecting at least two pixels. The connecting means include means for switching the connection on or off. The pixels are designed such that, if at least two pixels are connected, the photocharges generated in said connected pixels are combined in one of the connected pixels, whereby the spatial resolution of the sensor is reduced.

The method according to the invention for detecting electromagnetic radiation using the optoelectronic sensor according to the invention comprises the steps of generating an electric photocharge as a function of incoming electromagnetic radiation, and electrically connecting at least two pixels. The photocharges generated in the connected pixels are combined in one of the connected pixels, whereby the spatial resolution of the sensor is reduced.

In this document, the term "light" is used for any kind of electromagnetic radiation, such as visible light, infrared (IR) or ultraviolet (UV) radiation.

The invention makes it possible to vary the spatial resolution, the light sensitivity and/or the readout velocity by purely electronic means. The sensor can be manufactured in any CMOS technology without adding modified or additional steps. The sensors total readout time and/or power consumption can be reduced by reducing the spatial resolution. In the sensor, groups of pixels are preferably isolated from each other by a depleted transistor channel, which may also be switched into a conductive state, thus increasing the light sensitivity of a "super-pixel" composed of several pixels. Thus, in the image sensor according to the invention the light sensitivity or the spatial resolution can be varied purely electronically.

Reducing the spatial resolution by connecting pixels according to the invention has the advantage of an increased light sensitivity, and, moreover, of being offset free because the signal of each pixel is read out via the same sensing node. This does not hold if the reduction of the resolution is only carried out by averaging after reading out The power consumption of the sensor is reduced at a constant frame frequency if the spatial resolution is reduced, because only those pixels have to be supplied with voltage which effectively have to be read out.

The invention also encompasses an architecture of control lines for controlling connecting switches between pixels in a two-dimensional sensor. With this architecture, square fields with $2^{2n}$(=4, 16, 64, ... pixels, where n=1, 2, 3, ... is an integer, can be formed by control lines oriented in one single direction. The invention further encompasses an architecture of the above-mentioned control lines which makes it possible to form rectangular fields with pxq pixels, where p=1, 2, ... and q=1, 2, ... are integers.

BRIEF DESCRIPTION OF THE DRAWINGS

In the following, the invention and, for comparison, the state of the art are described in greater detail with reference to the accompanying drawings, wherein show:

FIG. 6 the state of signals for skimming binning and reset for a sensor according to the invention with 4×4 binning;

DETAILED DESCRIPTION OF THE PREFERRED EMBODIMENTS

Figure 1:
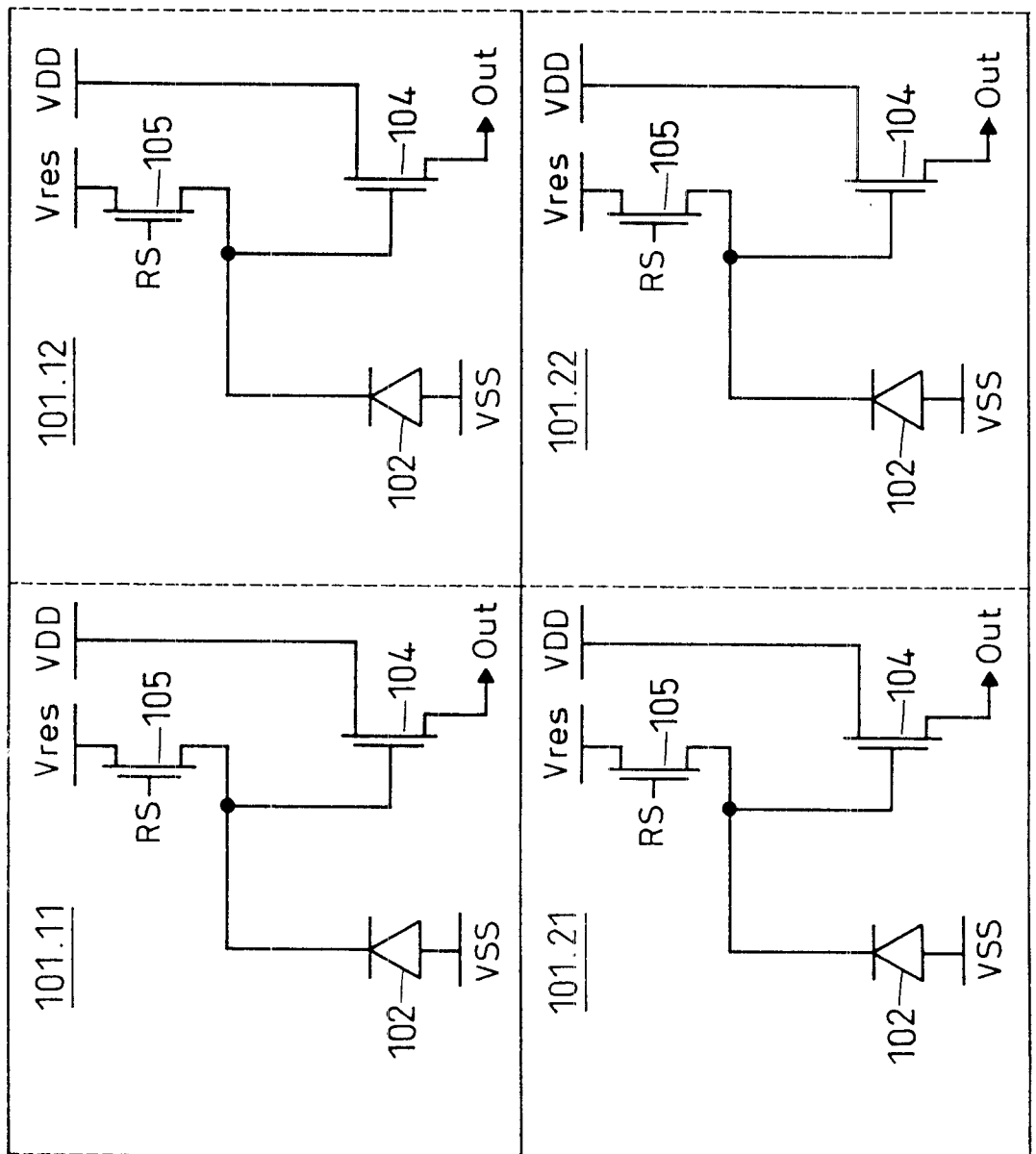
FIG. 1 a basic circuit diagram of an APS sensor according to the state of the art.

FIG. 1 shows a basic circuit diagram of an APS sensor according to the state of the art. Each pixel 101.11, 101.12, 101.21, 101.22, . . . can be addressed and read out individually. In each pixel 101.11, 101.12, 101.21, 101.22, . . . the charge or current generated by a photodetector 102 is actively converted into a voltage or current signal by an output amplifier or output buffer 104, e.g., by a field effect transistor (FET) as a source follower. The photodetector 102 can be reset by a switch 105. VDD designates a supply voltage, VSS a ground voltage, Vres a reset voltage and RS a reset signal.

Figure 2:
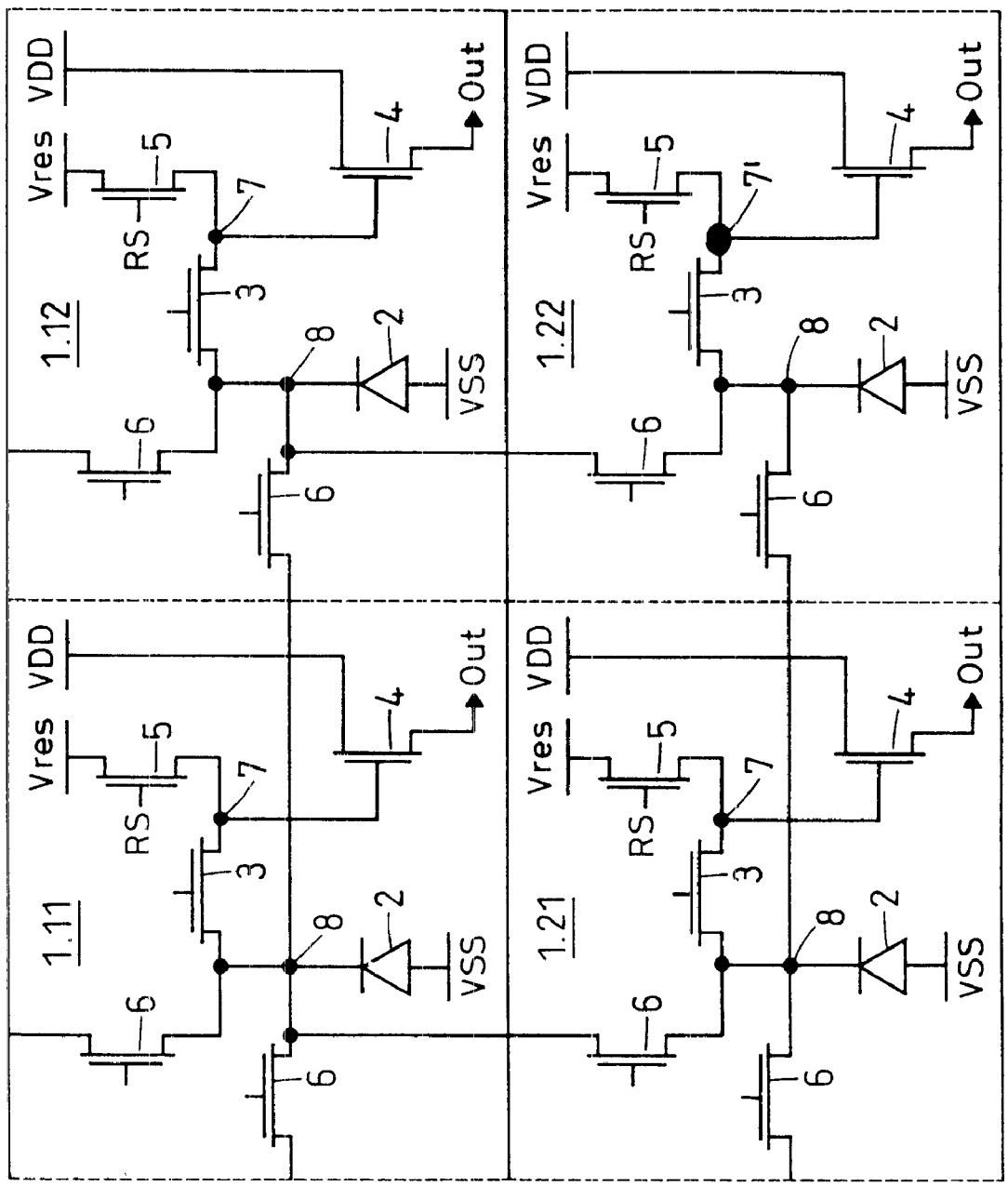
FIG. 2 a basic circuit diagram of a sensor according to the invention.
Figure 3:
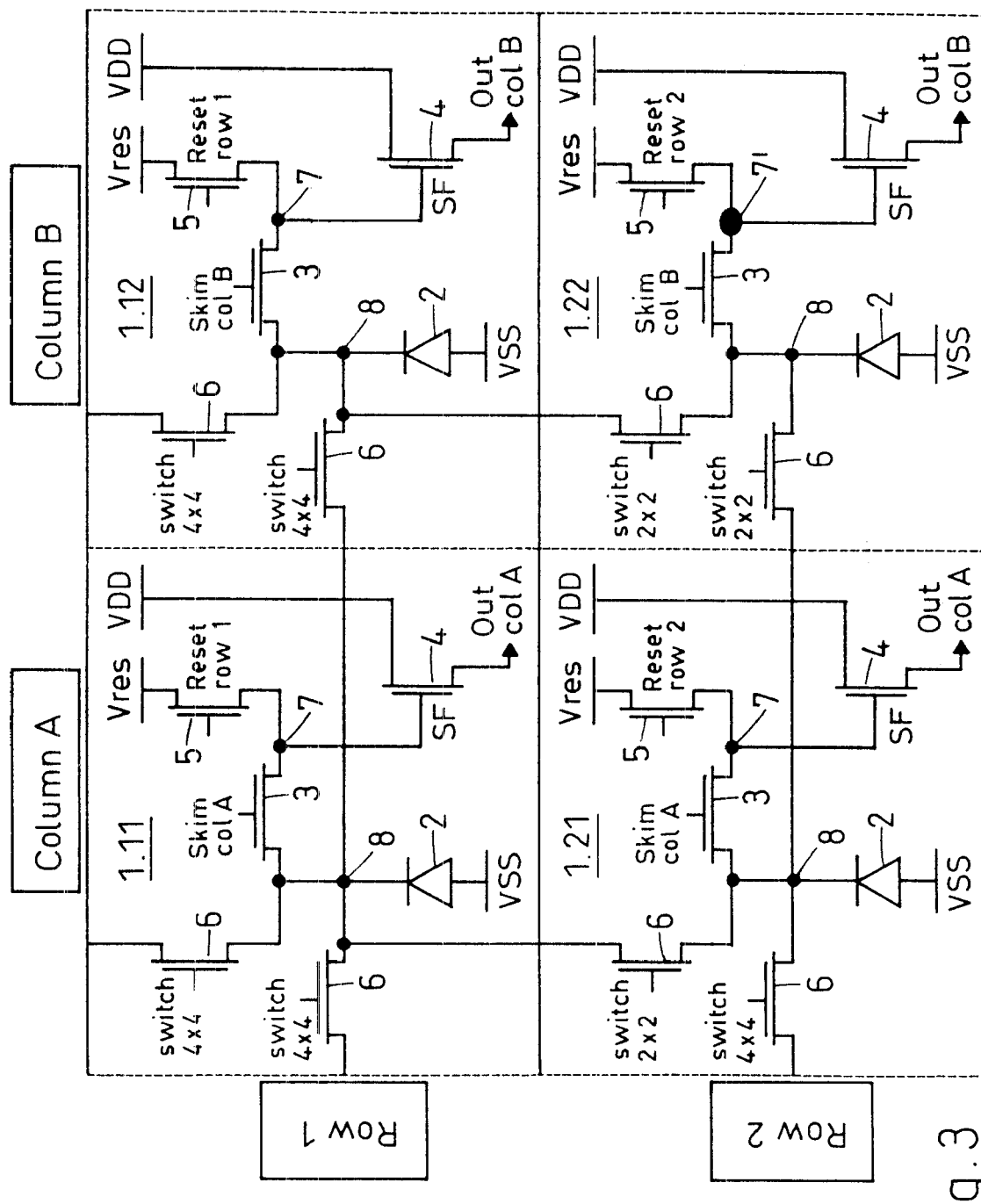
FIG. 3 a more detailed basic circuit diagram of the sensor of FIG. 2.

FIGS. 2 and 3 show a first embodiment of the invention. A plurality of pixels 1.11, 1.12, 1.21, 1.22 are assembled in order to form an image or array sensor. The pixels 1.11, 1.12, 1.21, 1.22 are addressed and read out individually. In the example of FIGS. 2 and 3, four pixels 1.11, 1.12, 1.21, 1.22 are connected to form a square field or "super-pixel". In each pixel 1.11, 1.12, 1.21, 1.22 incident light is converted by a photodetector 2, preferably a semiconductor photodetector such as a photodiode, into a photocurrent. A field effect transistor (FET) 3 with a constant gate voltage connects the photodetector 2 with a sensing node 7; for reasons explained below, this FET 3 will be called the "skimming FET". An input of an output amplifier or output buffer 4, preferably the gate of a FET called the "amplifier FET" or "source follower FET", is connected to the sensing node 7. The sensing node 7 can be set to the reset voltage Vres by a switch 5, preferably a further FET called the "reset FET". By connections which can be switched on or off by further switches 6, preferably also realized as FETs called the "binning FETs", output ports or "summing nodes" 8 of several pixels 1.1, 1.12, 1.21, 1.22 can be connected.

The photocurrent flows from the photodetector 2 via the skimming FET 3 to the sensing node 7 and is integrated on the capacity of the sensing node 7. For this purpose, the parasitic depletion-layer capacitances of the FETs 3 connected to the sensing nodes 7 are preferably used. The source follower FET 4 or another signal amplification or buffer circuit is arranged according to the state of the art in such a way that the signal of the sensing node 7 can be further processed. After having been read out, a pixel 1.11, 1.12, 1.21, 1.22 is reset by the reset FET 5 to the reset voltage Vres.

Generally, the voltage signal generated at a sensing node 7 is inversely proportional to the capacitance of this node 7. If the sensing node 7 is connected directly to the photodiode 2 as in FIG. 1, the voltage at the node 7 is given by $$V_{sensnode}=(I_{photo} \cdot T_{int})/(C_{sensnode}+C_{diode}), \quad (1)$$

where $I_{photo}$ is the photocurrent generated in the photodiode 2, $T_{int}$ the integration time, $C_{sensnode}$ the parasitic capacitance of the sensing node 7 and $C_{diode}$ the parasitic capacitance of the photodiode 2. Since the parasitic capacitance $C_{diode}$ of the photodiode 2 is directly proportional to the light-sensitive area of the photodiode 2, it cannot be reduced arbitrarily. Due to this fact, the light sensitivity is limited.

By using a FET, i.e., the skimming FET 3, as a connection between the photodiode 2 and the sensing node 7, the parasitic capacitance of the photodiode 2 is separated from the sensing node 7. In order to increase the light sensitivity, the gate voltage of the skimming FET 3 is chosen such that the voltage at the output of the photodiode 2 remains constant at all times and, upon a reset, only the capacitance of the sensing node 7 is depleted. Thus, the voltage at the sensing node 7 is given by $$V_{sensnode}=(I_{photo} \cdot T_{int})/C_{sensnode} \quad (2)$$

A further increase of the light sensitivity can be achieved according to the invention by reducing the spatial resolution and guiding the photocurrent from several photodiodes 2, i.e., from several pixels 1.11, 1.12, 1.21, 1.22, to one single sensing node 7', e.g., of the pixel 1.22. For this purpose the output ports of the pixels 1.1 1, 1.12, 1.21, 1.22 are connected to each other by switches, preferably the binning FETs 6, thus forming a group, field or "super-pixel" of, e.g., 2×2 pixels 1.11, 1.12, 1.21, 1.22. Thus the number of pixels is reduced and their effective, light-sensitive area is increased; however, the parasitic capacity of the sensing nodes 7 remains constant. In order to transfer the photogenerated charges of the connected photodiodes to one sensing node 7', in each "super-pixel" only the sensing node 7' which is read out is reset to the reset voltage Vres. This can be accomplished by addressing reset switches 5 and skimming switches 3 in a bi-directional way, e.g., reset switches 5 in row direction and skimming switches 3 in column direction. In this case the voltage signal at the sensing node 7' is given by $$V_{sensnode}=(\Sigma I_{photo} \cdot T_{int})/C_{sensnode} \quad (3)$$

The signal deviation increases when the number of connected pixels 1.11, 1.12, 1.21, 1.22 increases, i.e., when the spatial resolution of the image or array sensor decreases. Thus, in the image sensor according to the invention the light sensitivity or the spatial resolution can be varied purely electronically.

In CMOS technologies, zones of various types of semiconductor material (p-type and n-type Silicon) can be produced. Today these zones are typically, however not exclusively, produced by implantation of appropriate doping atoms into the Silicon substrate. By using such doping (source/drain implant) in combination with a thin conductor (poly Silicon) that is separated by a thin isolator (gate oxide), FETs are produced in CMOS technologies. The source and drain regions of such FETs are also charge-accumulating regions and can be used as photodiodes.

In the sensor according to the invention, such FETs are used for separating the optically active areas of the detector elements from each other at a minimum distance. The detector elements are formed and/or contacted by source- and drain-implanted regions of the FETs. The channel zones of these FETs are depleted by applying an appropriate potential at the FET gate and separate the individual detector elements electrically from each other.

Figure 4:
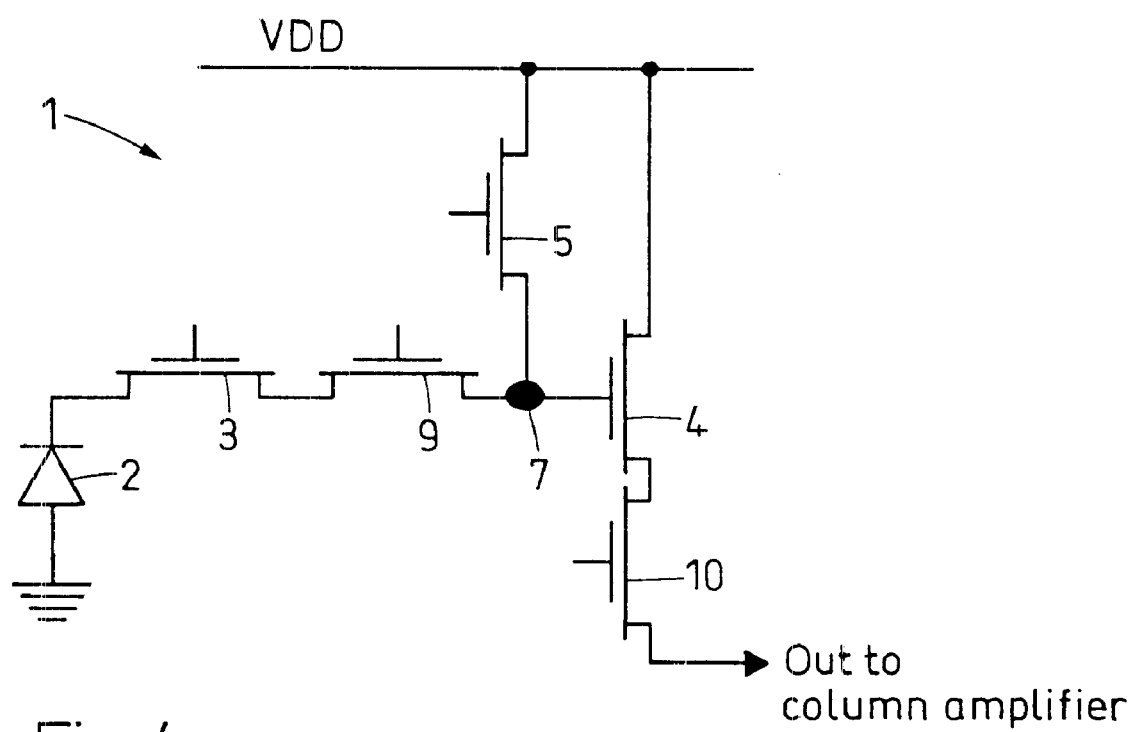
FIG. 4 a schematic of an analogue gate pixel.

FIG. 4 shows a more detailed circuit that can be used in a pixel 1 of the sensor according to the invention. In order to reduce the capacitance of the sensing node 7, the photodiode 2 is separated from the sensing node 7 by a simple MOS transistor, e.g., the skimming FET 3, with a suitable analogue gate voltage. Therefore, a pixel 1 containing this circuit may be called an "analogue gate pixel" (AGP). There may be a further transistor between the skimming FET 3 and the sensing node 7 for performing an electronic shutter function. A still further switch or transistor 10 at the output of the source follower FET 4 can be used as a row selector. The supply voltage VDD and the reset voltage Vres can be identical, i.e., short-circuited together.

In order to dispense with additional signal lines for connecting individual pixels 1.11, 1.12, 1.21, 1.22, ..., the photodetectors 2 are designed as source- and drain-implanted regions of the connecting switches 6 (binning FETs), or are designed so as to overlap with these regions. For variably reducing the spatial resolution of the sensor, it is merely necessary to additionally introduce control lines (gate terminals of the binning FETs 6) for the connecting switches 6.

Turning again to FIG. 3, the readout addressing of the sensor according to the invention is explained. Generally, in an APS sensor there is a signal bus in column direction. The outputs of each pixel in the corresponding column are connected to this bus via a row select transistor (see FIG. 4, FET 10). The row select transistors of a row are controlled by a signal line in the row direction. With this arrangement, it is possible to address each individual pixel in the sensor by choosing a certain column and a certain row. After reading out a row of pixels, the voltage in the sensing nodes of these pixels is reset to a reset voltage Vres by putting the reset transistors 5 into a conductive state. These switches 5 are preferably also connected in the row direction. In the sensor according to the invention shown in FIG. 3, the signals for the reset FETs 5 are connected in rows, whereas the signals for the skimming FETs 3 are connected in columns and can be switched. on, off or to an analogue voltage. The skimming FETs 3 are used for the charge skimming and/or as shutter transistors to prevent a reset of the photodiodes 2.

In order to perform charge binning, the sensor is switched from the regular mode to the binning mode for at least one frame or picture. The signals described hereafter are then once set to certain values and do not change any more until the binning mode is switched off. The following description of the binning mode refers to n-MOS transistors, which means that the switches 3–6, 9–10 conduct if the signals applied to their gates are high (VDD). The functionality for p-MOS transistors would be the same, but all signals would be inverted.

First the 2×2 binning mode is described. In order to perform binning from four pixels 1.11, 1.12, 1.21, 1.22 to one "super-pixel" (2×2), the gate voltage of the 2×2 switches 6 is set to VDD and thus the 4 pixels 1.11, 1.12, 1.21, 1.22 are connected together. Now the pixel 7' from which the output signal is to be read out has to be chosen; this might be, e.g., the pixel 1.22 in row 2, column B. A reset of the diodes 2 in any other pixel 1.11, 1.12, 1.21 must be avoided. Since the reset FETs 5 are connected in the row direction, such an unwanted reset in row 1 (pixels 1.11 , 1.12) is avoided by fixing the gates of the reset FETs 5 in this row 1 to ground (VSS). In order to avoid the reset of the diode 2 in the pixel 1.21 in row 2, column A, the skimming FET 3 in this pixel 1.22 must be blocked. This blocking is done by setting the gate voltages of the skimming FETs 3 of column A (pixels 1.11, 1.21) to ground (VSS). With these measures, the entire charge generated in the four photodiodes 1.11, 1.12, 1.21, 1.22 must go through the read-out pixel 1.22 in row 2, column B. In order to take advantage of the charge skimming principle, and thus to increase the signal on the sensing node 7' of this read-out pixel1.22, the potential of the skimming FETs 3 in column B (pixels 1.12, 1.22) is set to an analogue voltage between VDD and VSS. It is evident that only reading out the output of the pixel 1.22 in row 2, column B yields useful data.

Figure 5:
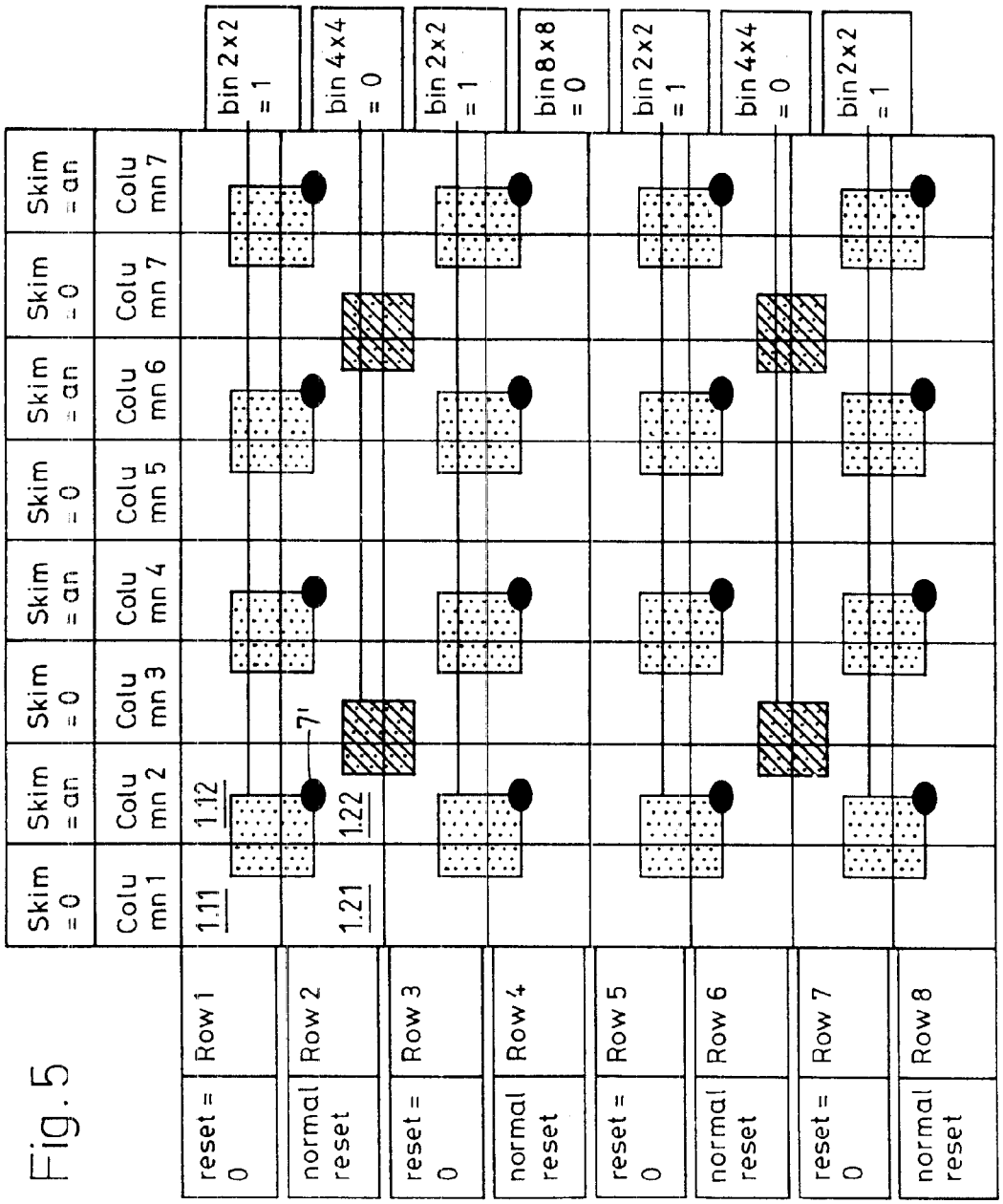
FIG. 5 the state of signals for skimming binning and reset for a sensor according to the invention with 2×2 binning.
Figure 6:
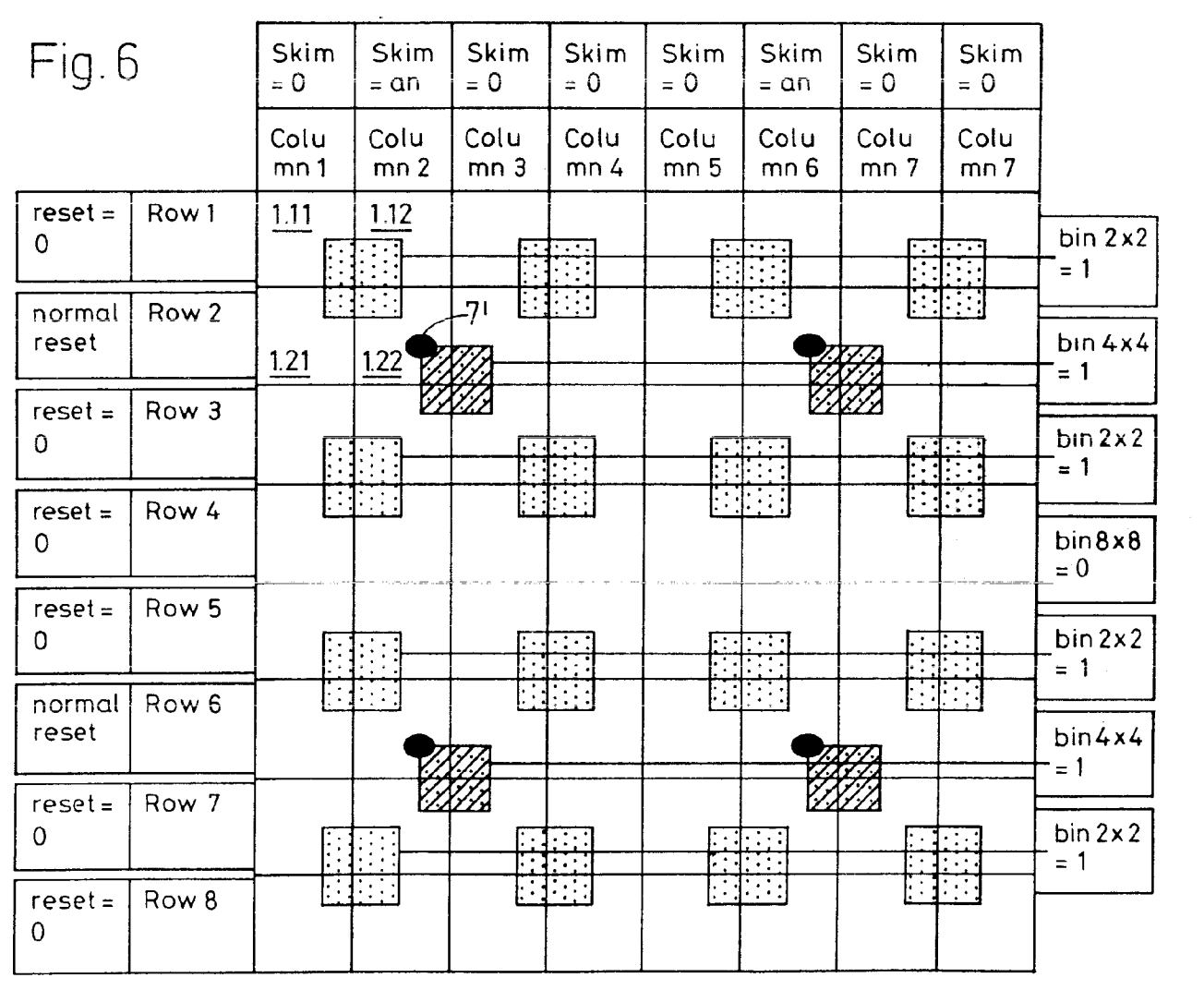

FIGS. 5 and 6 show overviews of the described signals and states for the 2×2 and 4×4 binning modes, respectively. In both figures, a sensor area of 8×8 pixels 1.11, 1.12, ..., 1.21, 1.22, ... is shown. Of course, the entire sensor might have a larger area and a larger number of pixels. Squares filled with dots represent pixels connected together in the 2×2 binning mode, hatched squares represent pixels connected together in the 4×4 binning mode. The black dots indicate the pixels which are read out in the respective sensing nodes 7'.

The Skim signal is the signal used for the charge skimming FETs; "Skim=0" means that the skimming FETs 3 in this column are blocked (gates connected to VSS), whereas "Skim=an" means that in this column the gates of the skimming FETs 3 are set to an analogue fixed voltage between VDD and VSS. "Reset=0" means that in this row no reset is performed, i.e., the gates of the reset FETs 5 are set to VSS; "normal reset" means that in this row the reset is performed after the pixels in the row have been read out. "Bin 2×2=1" means that the 2×2 binning mode is on, and that the gates of the binning FETs 6 used for this mode are connected to VDD or to an analogue voltage which lies between VDD and VSS but is higher than the analogue voltage of the skimming FETs 3. "Bin 4×4=0" and "bin 8×8=0" mean that the corresponding lines are set to VSS or to ground, i.e., the corresponding binning FETs 6 are blocked and do not allow photocharge binning.

In the embodiments of FIGS. 5 and 6, the line for 8×8 binning is fixed to ground on hardware base for reasons of simplicity, i.e., the binning is restricted to the 2×2 and 4×4 binning modes. This measure guarantees a similar neighborhood for all pixels 1.11, 1.12, ..., 1.21, 1.22, .... It also yields the advantage of smaller spacing between the photodiodes 2 if they are separated by depleted transistor channels. Of course, it is possible to provide lines and switches for 8×8, 16×16, ..., $2^n \times 2^n$ binning modes.

Figure 7:
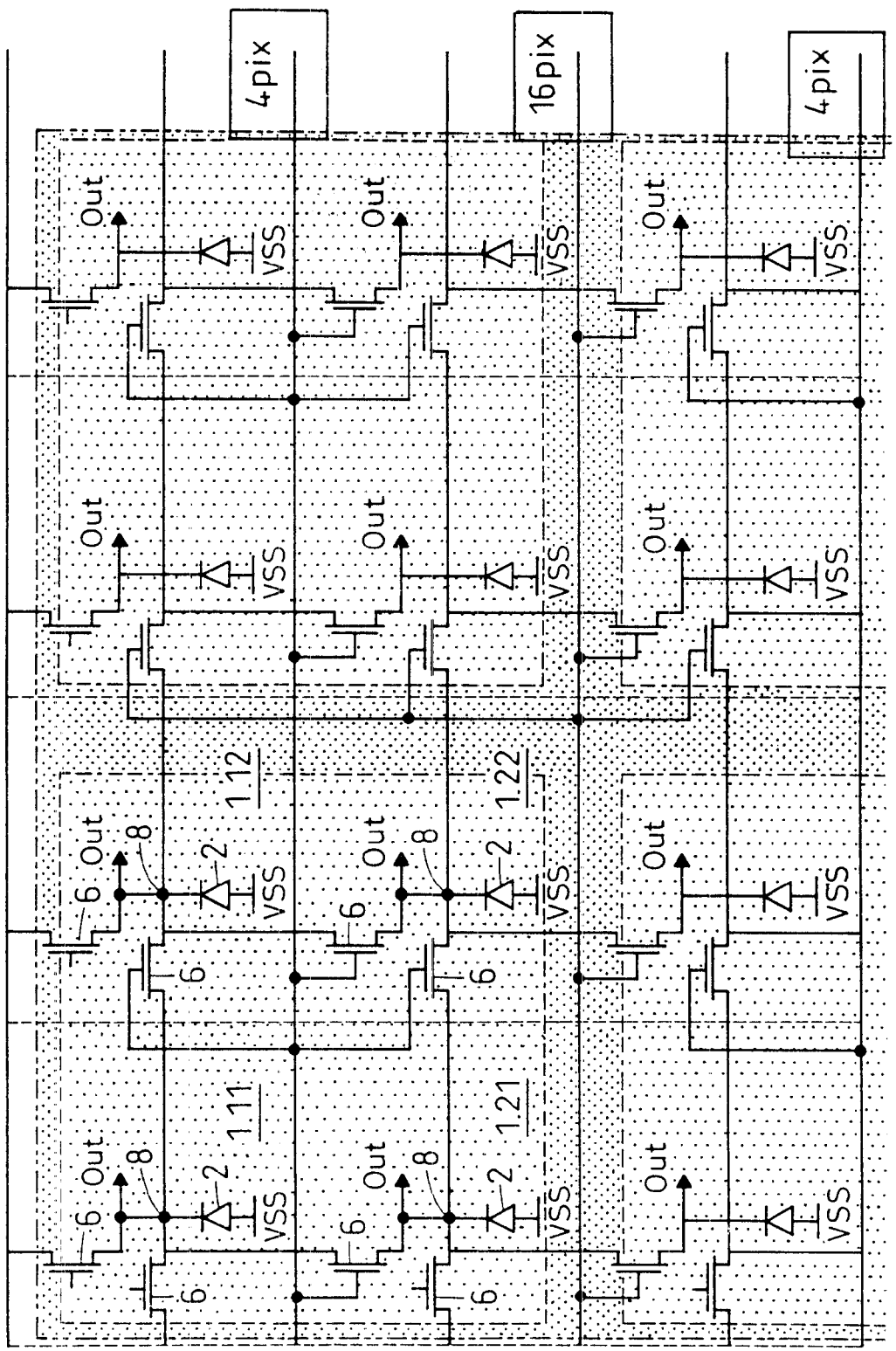
FIG. 7 an interleaved arrangement of a circuit for connecting pixels in a sensor according to the invention.

By an interleaved arrangement and control of the connecting switches 6 (binning FETs 6), "super-pixels" consisting of $2^{2n}$ (=4, 16, 64, ... ) connected pixels, where n =1, 2, 3, ... is an integer, can simply be formed, as shown in FIG. 7.

Figure 8:
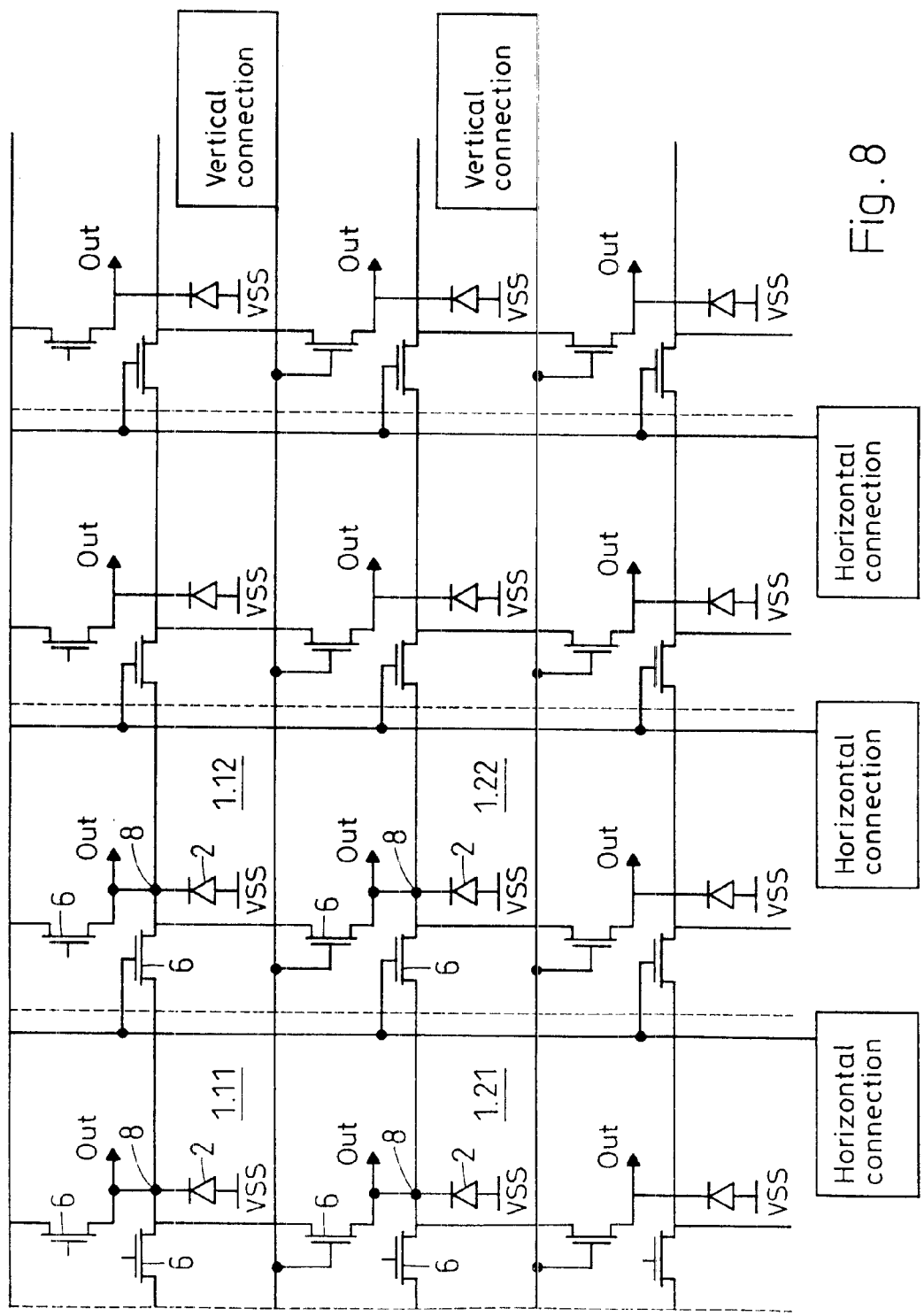
FIG. 8 a circuit of connecting switches with horizontally and vertically separated addressing in a sensor according to the invention.

By separately controlling the horizontal and vertical connecting switches 6 (binning FETs 6), rectangular fields or "super-pixels" with pxq connected pixels, where p=1, 2, ... and q=1, 2, ... are integers, can be formed using well-known electronic components and techniques, as shown in FIG. 8.

Numerous other embodiments may be envisaged, without departing from the spirit and scope of the invention.

What is claimed is:

1. An optoelectronic sensor comprising:
   at least two pixels, each pixel comprising a diode-based photodetector for generating an electric photocharge as a function of incident electromagnetic radiation, and
   means for electrically connecting said at least two pixels to each other to define at least two connected pixels, wherein said connecting means comprises switching means for clearing and completing the electrical connection between said at least two connected pixels such that photocharges generated in said at least two connected pixels are combined in one of said at least two connected pixels, whereby a spatial resolution of the sensor is reducable.

2. The sensor according to claim 1, wherein each pixel further comprises a reset switch for resetting a sensing node of said pixel.

3. The sensor according to claim 1, wherein said switching means are designed as transistor structures and said photodetectors are, or overlap with, drain and source terminals of said transistor structures.

4. The sensor according to claim 1, further comprising means for addressing said switching means in one of two dimensions so as to form square fields with $2^{2n}$ connected pixels, where n is an integer.

5. The sensor according to claim 1, further comprising means for addressing said switching means in two dimensions so as to form rectangular fields with pxq pixels, where p and q are integers.

6. The sensor according to claim 1, wherein said sensor is manufactured using a standard CMOS process.

7. The sensor according to claim 1, wherein each pixel comprises a charge detection circuit and a skimming transistor arranged between said photodetector and said charge detection circuit, said skimming transistor having a floating source and floating drain.

8. The sensor according to claim 7, wherein said skimming transistor is a field effect transistor.

9. The sensor according to claim 1, wherein said photodetectors are separated from each other by depleted channel zones of field-effect-transistor structures.

10. The sensor according to claim 9, wherein said reset switch is a field effect transistor.

11. A method for detecting electromagnetic radiation using the optoelectronic sensor according to claim 1, comprising the steps of:

generating electric photocharges as functions of incident electromagnetic radiation, electrically connecting at least two pixels to each other to define at least two connected pixels, and combining the photocharges generated in said at least two connected pixels in one of said at least two connected pixels, whereby the spatial resolution of the sensor is reduced.

12. The method according to claim 11, wherein a gate of a skimming transistor, which is a field-effect-transistor, is set to a DC potential, the absolute value of which is below an absolute value of a reset voltage.

13. The method according to claim 11, wherein pixels of a two-dimensional sensor are connected in one of two dimensions so as to form square fields with $2^{2n}$ connected pixels, where n is an integer.

14. The method according to claim 11, wherein pixels of a two-dimensional sensor are connected in two dimensions so as to form rectangular fields with p×q pixels, where p and q are integers.

* * * * *